(12) United States Patent
Jang et al.

(10) Patent No.: US 12,183,829 B2
(45) Date of Patent: Dec. 31, 2024

(54) THIN FILM TRANSISTOR, METHOD OF MANUFACTURING THE SAME, AND ELECTRONIC DEVICE

(71) Applicant: ADRC. CO. KR, Seoul (KR)

(72) Inventors: Jin Jang, Seoul (KR); Suhui Lee, Seoul (KR)

(73) Assignee: ADRC. CO. KR, Seoul (KR)

( * ) Notice: Subject to any disclaimer, the term of this patent is extended or adjusted under 35 U.S.C. 154(b) by 394 days.

(21) Appl. No.: 17/558,874

(22) Filed: Dec. 22, 2021

(65) Prior Publication Data

US 2022/0376112 A1 Nov. 24, 2022

(30) Foreign Application Priority Data

May 24, 2021 (KR) .......................... 10-2021-0066426

(51) Int. Cl.
*H01L 29/786* (2006.01)
*H01L 29/66* (2006.01)

(52) U.S. Cl.
CPC .... *H01L 29/7869* (2013.01); *H01L 29/66742* (2013.01); *H01L 29/78696* (2013.01)

(58) Field of Classification Search
CPC .......... H01L 29/7869; H01L 29/66742; H01L 29/78696; H01L 27/1225; H01L 29/66969; H01L 21/02565; H01L 21/02628; H01L 21/02664; H01L 29/24; C23C 18/1216; C23C 18/1258; C23C 18/1291
See application file for complete search history.

(56) References Cited

U.S. PATENT DOCUMENTS

| | | |
|---|---|---|
| 9,136,388 B2 | 9/2015 | Yamazaki et al. |
| 9,831,274 B2 | 11/2017 | Takahashi et al. |
| 9,871,058 B2 | 1/2018 | Takahashi et al. |
| 9,881,939 B2 | 1/2018 | Takahashi et al. |

(Continued)

FOREIGN PATENT DOCUMENTS

| | | |
|---|---|---|
| KR | 10-2019-0044159 | 4/2019 |
| KR | 10-2019-0078913 | 7/2019 |

(Continued)

OTHER PUBLICATIONS

Dimitrios Afouxenidis, "Chapter 7: Solution Processed Crystalline Indium Zinc Oxide (c-IZO) for High Performance Thin Film Transistors", Engineering Department, Lancaster University, UK Oct. 2018.

(Continued)

*Primary Examiner* — Victor A Mandala
(74) *Attorney, Agent, or Firm* — LEX IP MEISTER, PLLC

(57) ABSTRACT

Disclosed are a method of manufacturing a thin film transistor, a thin film transistor, and an electronic device. The method of manufacturing a thin film transistor includes forming an oxide semiconductor layer, forming a gate electrode overlapped with at least a portion of the oxide semiconductor layer, and forming a source electrode and a drain electrode electrically connected to the oxide semiconductor layer, wherein the forming of the oxide semiconductor layer includes preparing a precursor solution for an oxide semiconductor, and performing spray pyrolysis of the precursor solution for the oxide semiconductor to obtain a c-axis aligned crystalline oxide semiconductor.

16 Claims, 25 Drawing Sheets

(56) References Cited

U.S. PATENT DOCUMENTS

| | | | |
|---|---|---|---|
| 10,153,378 B2 | 12/2018 | Yamazaki et al. | |
| 10,991,829 B2 | 4/2021 | Yamazaki et al. | |
| 11,948,795 B2 | 4/2024 | Sung et al. | |
| 2007/0287221 A1* | 12/2007 | Ong | H01L 29/045 257/E21.464 |
| 2008/0023698 A1* | 1/2008 | Li | H01L 29/7869 257/66 |
| 2012/0058597 A1 | 3/2012 | Anthopoulos et al. | |
| 2015/0279674 A1 | 10/2015 | Cho et al. | |
| 2022/0140114 A1 | 5/2022 | Jang et al. | |
| 2022/0208807 A1* | 6/2022 | Choi | H01L 27/1285 |

FOREIGN PATENT DOCUMENTS

| | | |
|---|---|---|
| KR | 10-2019-0090082 | 7/2019 |
| KR | 10-2019-0119010 | 10/2019 |
| KR | 10-2020-0071673 | 6/2020 |
| KR | 10-2020-0109783 | 9/2020 |

OTHER PUBLICATIONS

Kyriakos Mouratis et al., "Annealing Effect on the Properties of Electrochromic V2O5 Thin Films Grown by Spray Deposition Technique", Nanomaterials 2020, 10, 2397, Nov. 30, 2020; doi:10.3390/nano10122397.

Saeed Rahemi Ardekani et al., "N-doped ZnO—CuO nanocomposite prepared by one-step ultrasonic spray pyrolysis and its photocatalytic activity", Chemical Physics Letters, vol. 705, 19-22, May 23, 2018.

Jewel Kumer Saha et al., "Significant improvement of spray pyrolyzed ZnO thin film by precursor optimization for high mobility thin film transistors", Scientific Reports (2020) 10:8999; https://doi.org/10.1038/s41598-020-65938-6.

Keunkyu Song et al., "Fully Flexible Solution-Deposited ZnO Thin-Film Transistors", Adv. Mater. 2010, 22, 4308-4312, DOI: 10.1002/adma.201002163.

Sung Woon Cho et al., "Bi-layer Channel Structure-Based Oxide Thin-Film Transistors Consisting of ZnO and Al-Doped ZnO with Different Al Compositions and Stacking Sequences", Electron. Mater. Lett., vol. 11, No. 2 (2015), pp. 198-205, Mar. 10, 2015; DOI: 10.1007/s13391-014-4305-1.

E. Fortunato et al., "High field-effect mobility zinc oxide thin film transistors produced at room temperature", Journal of Non-Crystalline Solids 338-340 (2004) 806-809; doi:10.1016/j.jnoncrysol.2004.03.096.

* cited by examiner

THIN FILM TRANSISTOR, METHOD OF MANUFACTURING THE SAME, AND ELECTRONIC DEVICE

CROSS-REFERENCE TO RELATED APPLICATION

This application claims priority to and the benefit of Korean Patent Application No. 10-2021-0066426 filed in the Korean Intellectual Property Office on May 24, 2021, the entire contents of which are incorporated herein by reference.

BACKGROUND OF THE INVENTION

(a) Field of the Invention

This disclosure relates to a thin film transistor, a method of manufacturing the same, and an electronic device.

(b) Description of the Related Art

A display device such as a liquid crystal display (LCD) or an organic light emitting diode display (OLED display) includes a thin film transistor (TFT) that is a three-terminal device as a switching device and/or a driving device.

Recently, as such a thin film transistor, a thin film transistor including an oxide semiconductor has been studied. However, oxide semiconductors are mostly included in an amorphous state, and in this case, there is a limit to improve electrical properties and stability thereof.

SUMMARY OF THE INVENTION

An embodiment provides a thin film transistor capable of being manufactured at a low cost and by a simple process and having improved electrical properties.

Another embodiment provides a method of manufacturing the thin film transistor.

Another embodiment provides an electronic device including the thin film transistor.

According to an embodiment, a method of manufacturing a thin film transistor includes forming an oxide semiconductor layer, forming a gate electrode overlapped with at least a portion of the oxide semiconductor layer, and forming a source electrode and a drain electrode electrically connected to the oxide semiconductor layer, wherein the forming of the oxide semiconductor layer includes preparing a precursor solution for an oxide semiconductor, and performing spray pyrolysis of the precursor solution for the oxide semiconductor to obtain a c-axis aligned crystalline oxide semiconductor.

The precursor solution for the oxide semiconductor may include a metal precursor, and the metal precursor may include a zinc precursor or at least three of an indium precursor, a gallium precursor, a tin precursor, and a zinc precursor.

The precursor solution for the oxide semiconductor may include an acetate-containing additive.

The additive may include ammonium acetate.

The performing of spray pyrolysis of the precursor solution for the oxide semiconductor may be performed at about 200° C. to about 500° C.

The performing of spray pyrolysis of the precursor solution for the oxide semiconductor may be performed on a hot plate or a heated substrate holder.

The c-axis aligned crystalline oxide semiconductor may include a plurality of grains oriented in a predetermined direction.

The XRD spectrum of the c-axis aligned crystalline oxide semiconductor may include a (009) diffraction peak as a maximum peak.

The c-axis aligned crystalline oxide semiconductor may include one of a c-axis aligned indium-gallium-zinc oxide, a c-axis aligned indium-gallium-tin oxide, a c-axis aligned indium-zinc-tin oxide, or a c-axis aligned crystalline indium-gallium-tin-zinc oxide.

The c-axis aligned crystalline oxide semiconductor may be a c-axis aligned zinc oxide, and the XRD spectrum of the c-axis aligned zinc oxide may include a (002) diffraction peak as a maximum peak.

The c-axis aligned crystalline oxide semiconductor may be one of a c-axis aligned indium-gallium-zinc oxide, a c-axis aligned indium-gallium-tin oxide, a c-axis aligned crystalline indium-zinc-tin oxide, a c-axis aligned gallium-indium-tin-zinc oxide, or a c-axis aligned zinc oxide.

The manufacturing method may further include exposing a portion of the c-axis aligned crystalline oxide semiconductor, and supplying a fluorine-containing gas to an exposed region of the c-axis aligned crystalline oxide semiconductor to perform plasma treatment, before forming the source electrode and the drain electrode.

The fluorine-containing gas may include at least one of carbon tetrafluoride ($CF_4$), nitrogen trifluoride ($NF_3$), or sulfur hexafluoride ($SF_6$).

The plasma treatment may be performed at about 20° C. to about 420° C.

According to another embodiment, a thin film transistor manufactured by the above method is provided.

According to another embodiment, a thin film transistor includes an oxide semiconductor layer, a gate electrode overlapped with the oxide semiconductor layer, a gate insulating layer between the oxide semiconductor layer and the gate electrode, and a source electrode and a drain electrode electrically connected to the oxide semiconductor layer, wherein the oxide semiconductor layer includes one of a c-axis aligned indium-gallium-zinc oxide, a c-axis aligned indium-gallium-tin oxide, a c-axis aligned indium-zinc-tin oxide, a c-axis aligned gallium-indium-tin-zinc oxide, or a c-axis aligned zinc oxide.

The XRD spectrum of the oxide semiconductor layer may include a (009) diffraction peak as a maximum peak (major peak).

The oxide semiconductor layer may include the c-axis aligned zinc oxide, and the XRD spectrum of the c-axis aligned zinc oxide may include a (002) diffraction peak as a maximum peak (major peak).

The oxide semiconductor layer may include a channel region overlapped with the gate electrode, and a conductive region other than the channel region and connected to the source electrode and the drain electrode, wherein the conductive region includes a fluorine element diffused in the c-axis aligned oxide semiconductor, and a concentration of fluorine element in the conductive region may be about $2.0 \times 10^{14}/cm^3$ to about $17.5 \times 10^{21}/cm^3$.

According to another embodiment, a display panel including the thin film transistor is provided.

According to another embodiment, an electronic device including the thin film transistor or the display panel is provided.

It is possible to realize a thin film transistor capable of being manufactured at a low cost and by a simple process and having improved electrical properties.

DETAILED DESCRIPTION OF THE EMBODIMENTS

Figure 1:
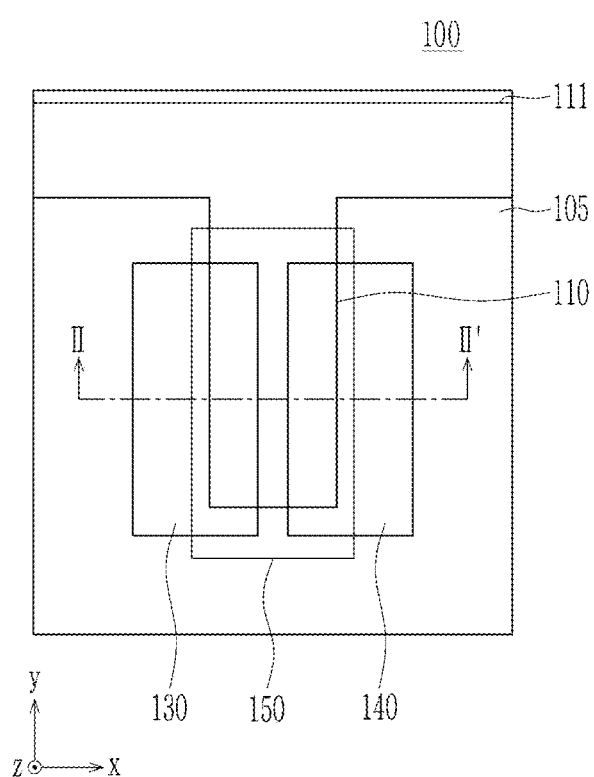
FIG. 1 is a schematic plan view of a thin film transistor according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, "combination" includes a mixture or a stacked structure of two or more.

Hereinafter, "metal" includes metals and semi-metals.

Hereinafter, a thin film transistor according to an embodiment will be described.

Figure 2:
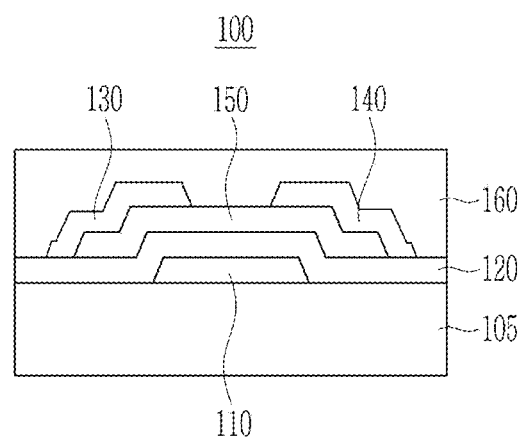
FIG. 2 is a cross-sectional view of an example taken along the line II-II' of FIG. 1.
Figure 3:
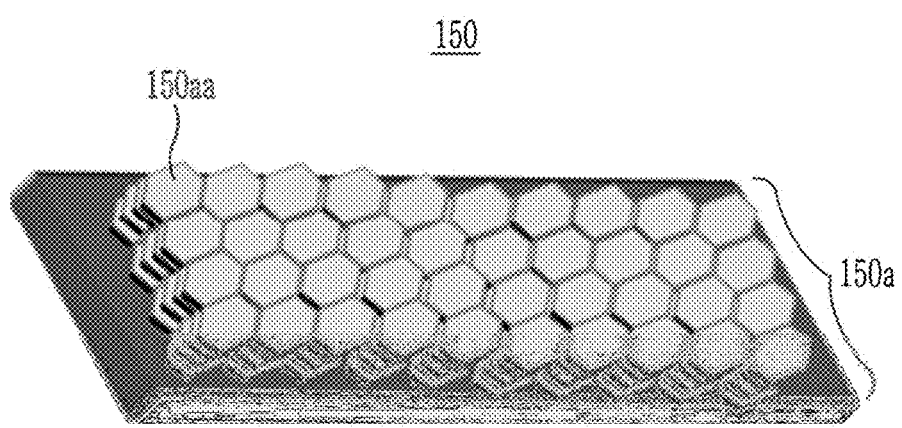
FIG. 3 is a schematic view showing an example of an arrangement state of an oxide semiconductor layer in the thin film transistor of FIGS. 1 and 2.

FIG. 1 is a schematic plan view of a thin film transistor according to an embodiment, FIG. 2 is a cross-sectional view taken along line II-II' of FIG. 1, and FIG. 3 is a schematic view showing an example of an arrangement state of an oxide semiconductor layer in the thin film transistor of FIGS. 1 and 2.

The thin film transistor 100 according to an embodiment includes a gate electrode 110, a gate insulating layer 120, an oxide semiconductor layer 150, a source electrode 130, a drain electrode 140, and a passivation layer 160.

The substrate 105 may be a supporting substrate supporting the thin film transistor 100, for example, a glass substrate, a polymer substrate, or a silicon wafer. The polymer substrate may include, for example, polyethylene terephthalate, polyethylene naphthalate, polycarbonate, polyacrylate, polymethyl methacrylate, polyimide, polyamide, polyamideimide, a copolymer thereof, or a combination thereof, but the present disclosure is not limited thereto.

The gate electrode 110 is electrically connected to a gate line 111 that transmits a gate signal. The gate electrode 110 may be, for example, made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto. However, when the substrate 105 is a silicon wafer, the gate electrode 110 may be a doped region of the silicon wafer. The gate electrode 110 may have one layer or two or more layers.

The gate insulating layer 120 may be disposed on the gate electrode 110 and cover the whole surface of the substrate 105. The gate insulating layer 120 may include an organic material, an inorganic material, and/or an organic-inorganic material, for example, an oxide, a nitride, and/or an oxynitride, for example, a silicon oxide, a silicon nitride, a silicon oxynitride, an aluminum oxide, an aluminum nitride, an aluminum oxynitride, or a combination thereof, but is not limited thereto. The gate insulating layer 120 may be one layer or two or more layers.

The oxide semiconductor layer 150 may be disposed to be overlapped with the gate electrode 110 with the gate insulating layer 120 interposed therebetween. The oxide semiconductor layer 150 may be an active layer and may include a channel region of the thin film transistor 100.

The oxide semiconductor layer 150 may include a c-axis aligned crystalline oxide semiconductor 150a.

Referring to FIG. 3, the c-axis aligned crystalline oxide semiconductor 150a may include a plurality of grains 150aa substantially uniformly oriented in a predetermined direction (e.g., one direction), and the plurality of grains 150aa may be aligned in parallel along the thickness direction and densely aligned along the width direction. Accordingly, unlike grains that are randomly oriented without directionality or formed by aggregation in a cluster form, there are few defects and thus an electrical path of electric charge may be effectively secured. The plurality of grains 133aa may be formed by spray pyrolysis, which will be described later, and diffusion lengths of metal precursors may be increased and the metal precursors may be effectively grown by a combination of a precursor solution for an oxide semiconductor used for spray pyrolysis and a predetermined condition (e.g., heat treatment temperature, etc.).

The c-axis aligned crystalline oxide semiconductor may be identified from an XRD spectrum obtained from an X-ray diffraction (XRD), and may include, for example, a major peak (e.g., a primary peak or a maximum peak) that is expressed as (00A) (where A is an integer from 1 to 9) in the XRD spectrum. (00A) may mean crystallinity grown in one direction. The XRD spectrum may include one or more minor peaks in addition to the maximum peak. The minor peak may be a small peak that is less than about 20%, for example, less than or equal to about 15%, less than or equal to about 10%, or less than or equal to about 5% of the intensity of the maximum peak, and the minor peak may not ideally be included. For example, the XRD spectrum of the c-axis aligned crystalline oxide semiconductor may include the maximum peak as a single peak.

The c-axis aligned crystalline oxide semiconductor may include one or more metals and/or semi-metals, and may include, for example, a crystalline oxide semiconductor including at least one of indium (In), gallium (Ga), zinc (Zn), or tin (Sn). For example, the c-axis aligned crystalline oxide semiconductor may be a single-membered oxide semiconductor, a binary oxide semiconductor, a ternary oxide semiconductor, or a quaternary oxide semiconductor, for example, a single-membered oxide semiconductor, a ternary oxide semiconductor, or a quaternary oxide semiconductor. For example, the c-axis aligned crystalline oxide semiconductor may be a single-membered oxide semiconductor including zinc or a ternary or quaternary oxide semiconductor including at least three of indium, gallium, tin, and zinc. For example, a c-axis aligned crystalline oxide semiconductor may include one of a c-axis aligned indium-gallium-zinc oxide, a c-axis aligned indium-gallium-tin oxide, a c-axis aligned indium-zinc-tin oxide, a c-axis aligned gallium-indium-tin-zinc oxide, or a c-axis aligned crystalline zinc oxide.

For example, the XRD spectrum of a ternary or quaternary oxide semiconductor such as indium-gallium-zinc oxide (In—Ga—Zn oxide), indium-gallium-tin oxide (In—Ga—Sn oxide), indium-zinc-tin oxide (In—Zn—Sn oxide), or indium-gallium-zinc-tin oxide (In—Ga—Zn—Sn oxide) may include the (009) diffraction peak (2θ is around 30 to 32 degrees) as a maximum peak (major peak). For example, in the zinc oxide (ZnO) semiconductor, a maximum peak (major peak) may appear at a (002) diffraction peak (2θ is around about 33 to 35 degrees, for example, about 34.5 degrees). On the other hand, in the c-axis aligned crystalline oxide semiconductor, the (100) diffraction peak (2θ is about 30 to 32 degrees, for example, about 31.9 degrees) in the XRD spectrum may be substantially not observed or very small.

The oxide semiconductor layer 150 may include acetate, and a significant amount of such acetate may be derived from an additive supplied in a spray pyrolysis to be described later. For example, the additive may be ammonium acetate, and thus the oxide semiconductor layer 150 may include an acetate derived from ammonium acetate. The oxide semiconductor layer 150 may include a higher content of acetate compared with the case where the additive is not used. Such a high content of acetate may effectively form the aforementioned c-axis aligned crystalline oxide semiconductor 150a by effectively arranging and growing the metal salt contained in the precursor solution for the oxide semiconductor in the spray pyrolysis to be described later.

The oxide semiconductor layer 150 may have a high film density by including the c-axis well-aligned crystalline oxide semiconductor 150a as described above. For example, the oxide semiconductor layer 150 including the c-axis aligned crystalline oxide semiconductor 150a may have a film density that is greater than or equal to about 3%, within the above range, greater than or equal to about 4%, greater than or equal to about 5%, greater than or equal to about 6%, greater than or equal to about 7%, greater than or equal to about 8%, greater than or equal to about 9%, greater than or equal to about 10%, greater than or equal to about 11%, or greater than or equal to about 12%, and within the above range, about 3% to about 30%, about 4% to about 30%, about 5% to about 30%, about 6% to about 30%, about 7% to about 30%, about 8% to about 30%, about 9% to about 30%, about 10% to about 30%, about 11% to about 30%, or about 12% to about 30%, higher than that of a thin film including grains that are randomly oriented without directionality or aggregated in a cluster form.

As an example, the film density of the oxide semiconductor layer 150 may be greater than or equal to about 4.7 g/cm$^3$, within the above range, greater than or equal to about 4.8 g/cm$^3$, greater than or equal to about 4.9 g/cm$^3$, greater than or equal to about 5.0 g/cm$^3$, or greater than or equal to about 5.1 g/cm$^3$, within the above range about 4.7 g/cm$^3$ to about 10 g/cm$^3$, about 4.8 g/cm$^3$ to about 10 g/cm$^3$, about 4.9 g/cm$^3$ to about 10 g/cm$^3$, about 5.0 g/cm$^3$ to about 10 g/cm$^3$, or about 5.1 g/cm$^3$ to about 10 g/cm$^3$.

The oxide semiconductor layer 150 may have a relatively low surface roughness due to the aforementioned alignment and high film density. For example, the oxide semiconductor layer 150 may have a surface roughness (for example, based on RMS) that is greater than or equal to about 10%, within the above range, greater than or equal to about 15%, greater than or equal to about 20%, greater than or equal to about 25%, greater than or equal to about 30%, greater than or equal to about 35%, greater than or equal to about 40%, greater than or equal to about 45%, or greater than or equal to about 50%, smaller than that of a thin film including grains that are randomly oriented without directionality or aggregated in a cluster form.

For example, the oxide semiconductor layer 150 may have a surface roughness (e.g., based RMS) of less than about 2 nm, within the above range less than or equal to about 1.9 nm, less than or equal to about 1.8 nm, less than or equal to about 1.7 nm, less than or equal to about 1.6 nm, or less than or equal to about 1.5 nm, and within the above range, greater than or equal to about 0.3 nm and less than about 2 nm, about 0.3 nm to about 1.9 nm, about 0.3 nm to about 1.8 nm, about 0.3 nm to about 1.7 nm, about 0.3 nm to about 1.6 nm, about 0.3 nm to about 1.5 nm, greater than or equal to about 0.5 nm and less than about 2 nm, about 0.5 nm to about 1.9 nm, about 0.5 nm to about 1.8 nm, about 0.5 nm to about 1.7 nm, about 0.5 nm to about 1.6 nm, or about 0.5 nm to about 1.5 nm.

The source electrode 130 and the drain electrode 140 may be disposed to face each other with the oxide semiconductor layer 150 as the center on the oxide semiconductor layer 150. The source electrode 130 and the drain electrode 140 may be electrically connected to the oxide semiconductor layer 150. The source electrode 130 may be electrically connected to a data line (not shown) that transmits a data signal, and the drain electrode 140 may have an island shape. The source electrode 130 and the drain electrode 140 may be, for example, made of a metal such as gold (Au), copper (Cu), nickel (Ni), aluminum (Al), molybdenum (Mo), chromium (Cr), tantalum (Ta), titanium (Ti), an alloy thereof, or a combination thereof, or a conductive oxide such as indium tin oxide (ITO), or indium zinc oxide (IZO), but is not limited thereto.

The passivation layer 160 may be disposed on the source electrode 130 and the drain electrode 140 and may protect and planarize the thin film transistor 100. The passivation layer 160 may include an organic material, an inorganic material, and/or an organic-inorganic material, and may include, for example, an oxide, a nitride, and/or an oxynitride, for example a silicon oxide, a silicon nitride, a silicon oxynitride, aluminum oxide, aluminum nitride, aluminum oxynitride, or a combination thereof, but is not limited thereto. The passivation layer 160 may be one layer or two or more layers. The passivation layer 160 may be omitted.

Hereinafter, a method for manufacturing the aforementioned thin film transistor is described.

A method of manufacturing a thin film transistor according to an embodiment includes forming an oxide semiconductor layer 150, forming a gate electrode 110 that is overlapped with a portion of the oxide semiconductor layer 150, forming a gate insulating layer 120 between the oxide semiconductor layer 150 and the gate electrode 110, forming a source electrode 130 and a drain electrode 140 electrically connected to the oxide semiconductor layer 150, and forming a passivation layer 160.

Specifically, referring to FIGS. 1 and 2, the method of manufacturing a thin film transistor according to an example may include forming a gate electrode 110 on a substrate 105, forming a gate insulating layer 120 on the gate electrode 110, forming an oxide semiconductor layer 150 on the gate insulating layer 120, forming a source electrode 130 and a drain electrode 140 on the oxide semiconductor layer 150, and forming a passivation layer 160.

The gate electrode 110 may be formed by, for example, vapor deposition, for example sputtering gold (Au), copper (Cu), nickel (Ni), aluminum (Al), molybdenum (Mo), chromium (Cr), tantalum (Ta), titanium (Ti), an alloy thereof, or a combination thereof, followed by patterning the resultant. The gate electrode 110 may be formed at a temperature higher than room temperature, for example at a temperature of greater than or equal to about 50° C., greater than or equal to about 70° C., greater than or equal to about 90° C., greater than or equal to about 100° C., greater than or equal to about 120° C., or greater than or equal to about 150° C., and within the above range, about 50° C. to about 300° C., about 70° C. to about 300° C., about 90° C. to about 300° C., about 100° C. to about 300° C., about 120° C. to about 300° C., about 150° C. to about 300° C., about 50° C. to about 200° C., about 70° C. to about 200° C., about 90° C. to about 200° C., about 100° C. to about 200° C., about 120° C. to about 200° C., or about 150° C. to about 200° C.

The gate insulating layer 120 may be formed on the whole surface of the substrate 105 including the gate electrode 110, and may be formed by chemical vapor deposition or a solution process of, for example, an oxide, a nitride, an oxynitride, and/or organic material. The solution process may be, for example, spin coating, slit coating, or inkjet coating, but is not limited thereto. The gate insulating layer 120 may be formed in one or two or more layers, and may include, for example, an oxide layer made of an oxide such as a silicon oxide or an aluminum oxide and a nitride layer made of a nitride such as a silicon nitride or an aluminum nitride. The gate insulating layer 120 may be formed at a temperature higher than that of the gate electrode 110, for example at a temperature of greater than or equal to about 120° C., greater than or equal to about 150° C., greater than or equal to about 200° C., greater than or equal to about 250° C., greater than or equal to about 300° C., or greater than or equal to about 350° C., within the above range, about 120° C. to about 500° C., about 150° C. to about 500° C., about 200° C. to about 500° C., about 250° C. to about 500° C., about 300° C. to about 500° C., about 350° C. to about 500° C., about 120° C. to about 400° C., about 150° C. to about 400° C., about 200° C. to about 400° C., about 250° C. to about 400° C., about 300° C. to about 400° C., or about 350° C. to about 400° C.

The forming of the oxide semiconductor layer 150 may include preparing a precursor solution for the oxide semiconductor, and performing spray pyrolysis of the precursor solution for the oxide semiconductor.

The precursor solution for the oxide semiconductor may include a metal precursor, an additive, and a solvent.

The metal precursor may include, for example, an indium precursor, a gallium precursor, a zinc precursor, and/or a tin precursor. For example, the metal precursor may be a zinc precursor or may include at least three of an indium precursor, a gallium precursor, a tin precursor, or a zinc precursor. For example, the metal precursor may be a zinc precursor; a combination of an indium precursor, a gallium precursor, and a zinc precursor; a combination of an indium precursor, a gallium precursor, and a tin precursor; a combination of an indium precursor, a zinc precursor, and a tin precursor, or a combination of an indium precursor, a gallium precursor, a tin precursor, and a zinc precursor.

The zinc precursor may be, for example, a zinc salt, a zinc hydroxide, a zinc alkoxide, a hydrate thereof, or a combination thereof, for example zinc acetate, zinc acetate dihydrate, zinc chloride, zinc chloride hydrate, zinc fluoride, zinc fluoride hydrate, zinc acetylacetonate hydrate, zinc acrylate, zinc nitrate, zinc nitrate hydrate, indium nitrate, indium nitrate hydrate, a hydrate thereof, or a combination thereof, but is not limited thereto.

The indium precursor may be, for example, an indium salt, indium hydroxide, indium alkoxide, a hydrate thereof, or a combination thereof, for example indium chloride, indium chloride dihydrate, indium bromide, indium iodide, indium fluoride, indium fluoride hydrate, indium acetate, indium acetate dihydrate, indium acetylacetonate hydrate, indium nitrate, indium nitrate hydrate, indium nitrate, indium nitrate hydrate, a hydrate thereof, or a combination thereof, but is not limited thereto.

The gallium precursor may be, for example, a gallium salt, gallium hydroxide, gallium alkoxide, a hydrate thereof, or a combination thereof, for example gallium chloride, gallium chloride hydrate, gallium bromide, gallium iodide, gallium fluoride, gallium fluoride hydrate, gallium acetate, gallium acetate dihydrate, gallium acetylacetonate hydrate, gallium nitrate, gallium nitrate hydrate, a hydrate thereof, or a combination thereof, but is not limited thereto.

The tin precursor may be, for example, a tin salt, a tin hydroxide, a tin alkoxide, a hydrate thereof, or a combination thereof, for example tin chloride, tin chloride hydrate, tin bromide, tin iodide, tin fluoride, tin fluoride hydrate, tin acetate, tin acetate dihydrate, tin acetylacetonate hydrate, tin acetylacetonate hydrate, tin nitrate, tin nitrate hydrate, a hydrate thereof, or a combination thereof, but is not limited thereto.

When there are two or more metal precursors, a ratio between the metal precursors may be determined as a desired atomic ratio in consideration of electrical properties. Two metals in the precursors may be included in a mole ratio of, for example, about 1:10 to about 10:1, about 2:8 to about 8:2, about 3:7 to about 7:3, about 4:6 to about 6:4, or about 5:5, but the present disclosure is not limited thereto.

Each metal precursor may be included in an amount of about 0.1 wt % to about 50 wt %, within the above range, about 1 wt % to about 40 wt % or about 5 wt % to about 30 wt % based on the precursor solution for the oxide semiconductor.

The additive may include acetate, for example ammonium acetate. Such an additive may increase solubility of the aforementioned metal precursor by providing additional acetate in the precursor solution for the oxide semiconductor, while reducing defects in the thin film and forming effective grains in the spray pyrolysis to be described later.

Specifically, the additive may decrease an evaporation rate of the solvent in the spray pyrolysis and increase diffusion lengths of droplets of the precursor solution for the oxide semiconductor sprayed at a predetermined pressure. Accordingly, it may prevent bubble rings (or coffee rings) and/or pinholes in a thin film due to the fast evaporation rate of the solvent, and thus forming a bubble-free and dense thin film. Whereas a plurality of bubble rings (or coffee rings) may cause irregular alignment of grains in a thin film and thus deteriorate electrical properties of the oxide semiconductor layer, as described above, the bubble-free thin film may induce substantially uniform alignment of the grains and thus provide improved electrical properties without deteriorating this electrical property. In addition, this bubble-free thin film may be realized at a lower temperature than that of a thin film formed of a precursor solution including no additive, thereby lowering a spray pyrolysis temperature. In addition, as the diffusion lengths of the sprayed droplets of the precursor solution for the oxide semiconductor are increased as aforementioned, the grains may be induced to have lateral growth of nuclei and thereby, bi-dimensional growth, resultantly growing into a c-axis aligned crystalline oxide semiconductor including a plurality of the grains 150aa substantially uniformly aligned in a predetermined direction (e.g., one direction) as shown in FIG. 3.

The additive may be included in an amount of about 0.001 wt % to about 20 wt %, and within the above range, about 0.01 wt % to about 15 wt %, about 0.01 wt % to about 12 wt %, about 0.01 wt % to about 10 wt %, about 0.01 to about 7 wt %, or about 0.01 to about 5 wt % in the precursor solution for the oxide semiconductor.

The additive may be mixed with the metal precursor solution after being prepared in a separate solvent, or may be prepared by mixing the aforementioned metal precursor and the additive in a solvent.

The solvent is not particularly limited as long as it can dissolve the above components, and may be, for example, methanol, ethanol, propanol, isopropanol, 2-methoxyethanol, 2-ethoxyethanol, 2-propoxyethanol 2-butoxyethanol, methylcellosolve, ethylcellosolve, diethylene glycolmethylether, diethylene glycolethylether, dipropylene glycolmethylether, toluene, xylene, hexane, heptane, octane, ethylacetate, butylacetate, diethylene glycoldimethylether, diethylene glycoldimethylethylether, methyl ethoxy propionate, ethyl ethoxy propionate, ethyl lactate, propylene glycolmethyletheracetate, propylene glycolmethylether, propylene glycolpropylether, methylcellosolve acetate, ethylcellosolve acetate, diethylene glycolmethylacetate, diethylene glycolethylacetate, acetone, methylisobutylketone, cyclohexanone, dimethyl formamide (DMF), N,N-dimethyl acetamide (DMAc), N-methyl-2-pyrrolidone, γ-butyrolactone, diethylether, ethylene glycoldimethylether, diglyme, tetrahydrofuran, acetylacetone, acetonitrile, or a combination thereof, but is not limited thereto.

The precursor solution for the oxide semiconductor may be stirred at, for example, a predetermined temperature. For example, after stirring at a temperature of about 30° C. to about 60° C., filtering may be further performed.

The spray pyrolysis of the precursor solution for the oxide semiconductor may be performed, for example, by disposing a substrate on a hot plate or a heated substrate holder, which may supply a high temperature of about 200° C. or higher. The spray pyrolysis of the precursor solution for the oxide semiconductor may be performed for example at about 200° C. to about 500° C. and within the above range, about 250° C. to about 500° C., about 300° C. to about 500° C., about 300° C. to about 450° C., or about 350° C. to about 450° C. Herein, the temperature may be, for example, a temperature of the substrate and for example, a surface temperature of the hot plate.

The spray pyrolysis may be performed in an air atmosphere or a nitrogen atmosphere. The spraying time and interval may be varied in consideration of the concentration of the precursor solution for the oxide semiconductor and the thickness to be formed, and the spraying may be, for example, performed at once or at predetermined intervals for about 1 second to about 100 seconds.

The source electrode 130 and the drain electrode 140 may be formed by vapor deposition, such as sputtering of, for example, a metal such as gold (Au), copper (Cu), nickel (Ni), aluminum (Al), molybdenum (Mo), chromium (Cr), tantalum (Ta), titanium (Ti), an alloy thereof or a conductive oxide such as indium tin oxide (ITO) or indium zinc oxide (IZO) on the oxide semiconductor layer 150, and then patterning the resultant. For example, when the source electrode 130 and the drain electrode 140 are formed of a metal, the source electrode 130 and the drain electrode 140 may be formed within the same temperature range as that for forming the gate electrode 110. For example, when the source electrode 130 and the drain electrode 140 are formed of conductive oxide, the source electrode 130 and the drain electrode 140 may be formed within the temperature range of room temperature to about 150° C. and within the above range, the room temperature to about 120° C., the room temperature to about 100° C., or the room temperature to about 80° C.

In the forming of the passivation layer 160, for example, an oxide, a nitride, an oxynitride, and/or an organic material may be formed by chemical vapor deposition. The passivation layer 160 may be formed in one or two or more layers, and may include, for example, an oxide layer made of an oxide such as a silicon oxide or an aluminum oxide and a nitride layer made of a silicon nitride or aluminum nitride.

As described above, small defects in a thin film and effective formation of the grains into the bi-dimensional growth in the spray pyrolysis of the precursor solution for the oxide semiconductor may provide a thin and uniform c-axis aligned crystalline oxide semiconductor without a separate vacuum equipment, which is a high-performance oxide semiconductor lowering a manufacturing cost, simplifying a process, and having high electrical properties. The crystallinity of the c-axis aligned crystalline oxide semiconductor may be confirmed from a diffraction peak (e.g., a maximum peak at (002) or (009)) in the XRD spectrum and have relatively small surface roughness of less than about 2 nm and a high film density. The c-axis aligned crystalline oxide semiconductor may be, for example, one of a c-axis aligned indium-gallium-zinc oxide, a c-axis aligned indium-gallium-tin oxide, a c-axis aligned indium-zinc-tin oxide, a c-axis aligned gallium-indium-tin-zinc oxide, or a c-axis aligned zinc oxide.

Hereinafter, a thin film transistor according to another embodiment will be described.

Figure 4:
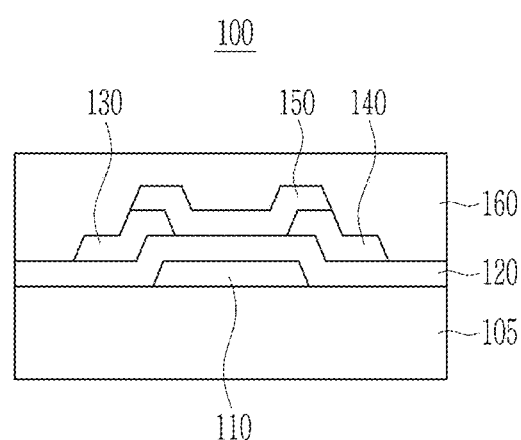
FIG. 4 is a cross-sectional view of another example taken along the line II-II' of FIG. 1.

FIG. 4 is a cross-sectional view of another example taken along the line II-II' of the thin film transistor of FIG. 1

Referring to FIG. 4, the thin film transistor 100 according to an embodiment includes a gate electrode 110, a gate insulating layer 120, an oxide semiconductor layer 150, a source electrode 130, and a drain electrode 140, and a passivation layer 160, like the aforementioned embodiment.

However, the thin film transistor 100 according to the present embodiment has a bottom contact structure in which the source electrode 130 and the drain electrode 140 are electrically connected to under the oxide semiconductor layer 150, unlike the aforementioned embodiment.

The descriptions of the gate electrode 110, the gate insulating layer 120, the oxide semiconductor layer 150, the source electrode 130, the drain electrode 140, and the passivation layer 160 are the same as described above, and the manufacturing method of each layer is also the same as described above.

Hereinafter, a thin film transistor according to another embodiment will be described.

Figure 5:
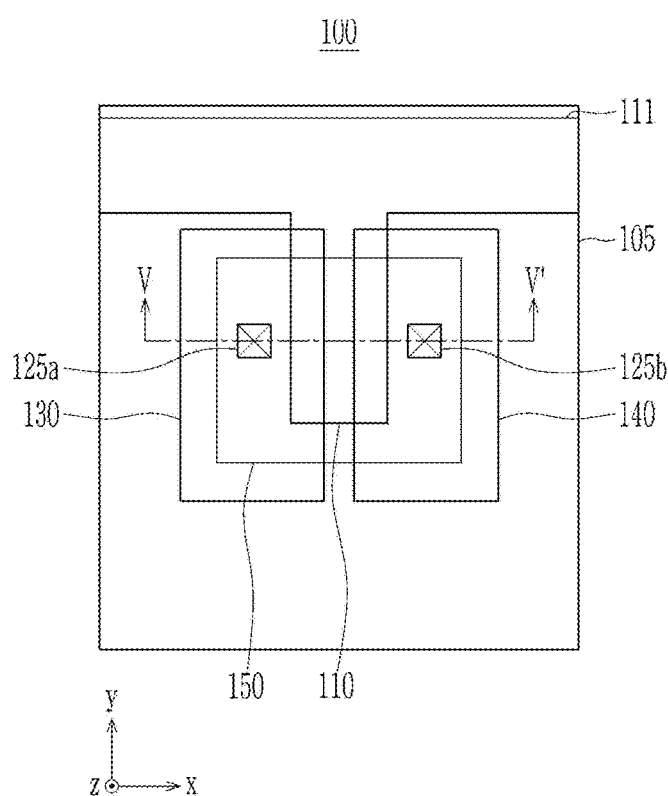
FIG. 5 is a schematic plan view of a thin film transistor according to another embodiment.
Figure 6:
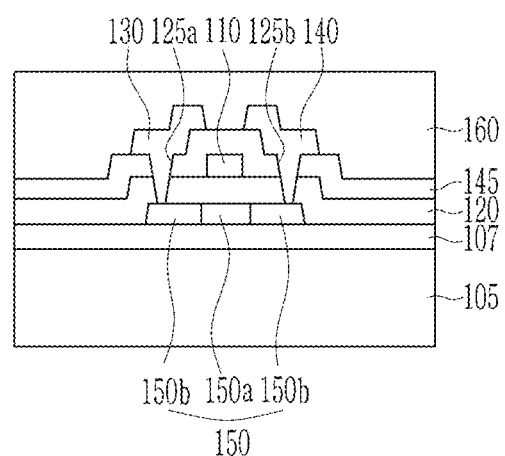
FIG. 6 is a cross-sectional view taken along the line V-V' of FIG. 5.

FIG. 5 is a schematic plan view of a thin film transistor according to another embodiment and FIG. 6 is a cross-sectional view taken along the line V-V' of FIG. 5.

The thin film transistor 100 according to the present embodiment includes a gate electrode 110, a gate insulating layer 120, an oxide semiconductor layer 150, a source electrode 130 and a drain electrode 140, and a passivation layer 160, like the embodiment described above.

However, the thin film transistor 100 according to the present embodiment may have a structure of a co-planar thin film transistor, unlike the aforementioned embodiment.

The substrate 105 may be a supporting substrate that supports the thin film transistor 100, and may be a glass plate, a polymer substrate, or a silicon wafer as described above.

A buffer layer 107 is formed on the substrate 105. The buffer layer 107 may include an organic material, an inorganic material, or an organic-inorganic material. The buffer layer 107 may include, for example, an oxide, a nitride, or an oxynitride, and may include, for example, a silicon oxide, a silicon nitride, a silicon oxynitride, or a combination thereof. However, the present disclosure is not limited thereto. The buffer layer 107 may be one or two or more layers, and may cover the whole surface of the substrate 105. The buffer layer 107 may be omitted.

The oxide semiconductor layer 150 is formed on the buffer layer 107. The oxide semiconductor layer 150 may include a c-axis aligned crystalline oxide semiconductor formed by spray pyrolysis using the precursor solution for the oxide semiconductor as described above. It may additionally include a significant amount of acetate, and may include a component derived from a significant amount of ammonium acetate. For example, the c-axis aligned crystalline oxide semiconductor may be one of a c-axis aligned indium-gallium-zinc oxide, a c-axis aligned indium-gallium-tin oxide, a c-axis aligned indium-zinc-tin oxide, a c-axis aligned gallium-indium-tin-zinc oxide, or a c-axis aligned zinc oxide.

The oxide semiconductor layer 150 includes a channel region 150a and a conductive region 150b. The channel region 150a may be a region overlapped with a gate electrode 110 to be described later or may be a semiconductor region. The conductive region 150b is a region other than the channel region 150a and may be disposed at both sides of the channel region 150a, and may be a conductive region. The conductive region 150b may be respectively connected to a source electrode 130 and a drain electrode 140 to be described later. The conductive region 150b may include a fluorine element diffused from the fluorine-containing gas, and the fluorine element may be diffused in the c-axis aligned oxide semiconductor of the conductive region 150b. A concentration of the fluorine element in the conductive region 150b may be, for example, about $2 \times 10^{14}/cm^3$ to $17.5 \times 10^{21}/cm^3$, but is not limited thereto. Such fluorine element may serve as an n+ dopant in the conductive region 150b.

The gate insulating layer 120 and the gate electrode 110 are formed on the oxide semiconductor layer 150. The gate electrode 110 is electrically connected to the gate line 111 and is overlapped with a portion of the oxide semiconductor layer 150. The gate insulating layer 120 is formed on the whole surface of the substrate 105, but is not limited thereto and may be patterned in substantially the same planar shape as the gate electrode 110. Detailed descriptions of the gate insulating layer 120 and the gate electrode 110 are the same as described above.

An interlayer insulating layer 145 is formed on the gate insulating layer 120 and the gate electrode 110. The interlayer insulating layer 145 may include an organic material, an inorganic material, or an organic-inorganic material, and may include, for example, an oxide, a nitride, or an oxynitride, for example, a silicon oxide, a silicon nitride, a silicon oxynitride, or a combination thereof, but is not limited thereto. The interlayer insulating layer 145 may have one layer or two or more layers. The gate insulating layer 120 and the interlayer insulating layer 145 have contact holes 125a and 125b exposing the oxide semiconductor layer 150, respectively.

A source electrode 130 and a drain electrode 140 are formed on the interlayer insulating layer 145. The source electrode 130 and the drain electrode 140 may be electrically connected to the conductive region 150b of the oxide semiconductor layer 150 through the contact holes 125a and 125b.

The passivation layer 160 is formed on the source electrode 130 and the drain electrode 140, and detailed descriptions thereof is the same as described above.

The thin film transistor according to the present embodiment also includes forming the oxide semiconductor layer 150, forming the gate electrode 110 overlapped with a portion of the oxide semiconductor layer 150, forming a gate insulating layer 120 between the oxide semiconductor layer 150 and the gate electrode 110, forming the source electrode 130 and the drain electrode 140 electrically connected to the oxide semiconductor layer 150, and forming a passivation layer 160, like the aforementioned embodiment. Each process is as described above.

Specifically, referring to FIGS. 5 and 6, a method of manufacturing the thin film transistor according to an embodiment may include forming a buffer layer 107 on the substrate 105, forming the oxide semiconductor layer 150 on the buffer layer 107, forming the gate insulating layer 120 on the oxide semiconductor layer 150, forming the gate electrode 110 where overlapped with a portion of the oxide semiconductor layer 150 on the gate insulating layer 120, forming a interlayer insulating layer 145 on the gate electrode 110, forming contact holes 125*a* and 125*b* exposing a portion of the oxide semiconductor layer 150 on the interlayer insulating layer 145 and the gate insulating layer 120, and forming the source electrode 130 and the drain electrode 140 connected to conductive regions 150*b* of the oxide semiconductor layer 150 through the contact holes 125*a* and 125*b*.

In addition, before forming the source electrode 130 and the drain electrode 140, a plasma treatment may be further performed by supplying the exposed regions of the oxide semiconductor layer 150 through the contact holes 125*a* and 125*b* with fluorine-containing gas. The fluorine-containing gas may include, for example, at least one of carbon tetrafluoride ($CF_4$), nitrogen trifluoride ($NF_3$), or sulfur hexafluoride ($SF_6$), but is not limited thereto. The plasma treatment may be for example performed at about 20° C. to 420° C., but is not limited thereto. The supplying of the fluorine-containing gas may form the exposed regions of the oxide semiconductor layer 150 into the conductive regions 150*b* with n+ conductivity.

The aforementioned thin film transistor may be included in various display panels, for example, a liquid crystal display panel, an organic light emitting diode display panel, a quantum dot display panel, or a perovskite display panel.

The aforementioned thin film transistor or display panel may be included in various electronic devices, and for example, may be included in a display device or a semiconductor device.

Hereinafter, the embodiments are illustrated in more detail with reference to examples. However, these examples are exemplary, and the present scope is not limited thereto.

PREPARATION EXAMPLES

Preparation Example 1

Under a nitrogen atmosphere, 442.36 mg of indium chloride, 170.47 mg of gallium nitrate hydrate, 272.6 mg of zinc acetate dihydrate (In:Ga:Zn=1:1:1), and 154.16 mg of ammonium acetate were put in 20 ml of 2-methoxyethanol and then, stirred for 2 hours, preparing a 0.1 M In—Ga—Zn precursor solution for oxide semiconductor.

Comparative Preparation Example 1

An In—Ga—Zn precursor solution for oxide semiconductor was prepared in the same manner as Preparation Example 1 except that the ammonium acetate was not included.

Preparation Example 2

Under a nitrogen atmosphere, 884.72 mg of indium chloride, 758.48 mg of tin chloride, 545.20 mg of zinc acetate dihydrate, and 308.32 mg of ammonium acetate were added to 20 ml of 2-methoxyethanol and then, stirred for 2 hours, preparing a 0.2 M In—Sn—Zn precursor solution for oxide semiconductor.

Comparative Preparation Example 2

An In—Ga—Zn precursor solution for oxide semiconductor was prepared in the same manner as Preparation Example 2 except that the ammonium acetate was not included.

Preparation Example 3

Under a nitrogen atmosphere, 421.162 mg of indium nitrate hydrate, 90.26 mg of tin chloride, and 154.16 mg of ammonium acetate were added to 20 ml of 2-methoxyethanol, and gallium nitrate in an amount (with each different ratio) of 5.1148 mg (In:Ga:Sn=7:0.1:2 (wt)), 15.3444 mg (In:Ga:Sn=7:0.3:2 (wt)), 25.574 mg (In:Ga:Sn=7:0.5:2 (wt)), 40.9184 mg (In:Ga:Sn=7:0.8:2 (wt)), or 51.148 mg (In:Ga:Sn=7:1:2 (wt)) was added thereto and then, stirred for 2 hours, preparing a 0.1 M In—Ga—Sn precursor solution for oxide semiconductor.

Comparative Preparation Example 3

An In—Ga—Sn precursor solution for oxide semiconductor was prepared according to the same manner as Preparation Example 3 except that the ammonium acetate was not included.

Preparation Example 4

Under a nitrogen atmosphere, 25.57 mg of gallium nitrate hexahydrate, 884.72 mg of indium chloride, 758.48 mg of tin chloride, 545.20 mg of zinc chloride, and 20 mg of ammonium acetate were added to 20 ml of 2-methoxyethanol and then, stirred for 2 hours, preparing a 0.1 M Ga—In—Sn—Zn precursor solution for oxide semiconductor.

Comparative Preparation Example 4

A Ga—In—Sn—Zn precursor solution for oxide semiconductor was prepared according to the same manner as Preparation Example 4 except that the ammonium acetate was not included.

Preparation Example 5

Under a nitrogen atmosphere, 878.04 mg of zinc acetate dihydrate, Zn (($CH_3COO)_2.2H_2O$), and 308.32 mg of ammonium acetate were added to 20 ml of 2-methoxyethanol and then, stirred for 2 hours, preparing a 0.2 M zinc precursor solution for oxide semiconductor.

Comparative Preparation Example 5

A zinc precursor solution for oxide semiconductor was prepared in the same manner as Preparation Example 5 except that the ammonium acetate was not included.

Manufacture of Thin Film Transistor

Example 1

On a glass substrate, a 40 nm-thick molybdenum layer was sputtered and then, patterned to form a gate electrode.

On the gate electrode, a 0.2 M aluminum oxide precursor solution (prepared by dissolving aluminum chloride in a mixed solvent of acrylonitrile and ethylene glycol) was spin-coated (2000 rpm, 30 seconds) and then, cured on a 250° C. hot plate for 5 minutes and heat-treated in a 350° C. furnace to form a 30 nm-thick gate insulating layer. After disposing the substrate on a hot plate, the In—Ga—Zn precursor solution for an oxide semiconductor according to Preparation Example 1 was spray-pyrolyzed (about 12 cm of a distance between spray nozzle and substrate, 60 seconds of total time at each cycle in the spraying) at 350° C. (or 375° C., 400° C., 425° C., or 450° C.) (a substrate temperature) to form a 40 nm-thick oxide semiconductor layer. On the oxide semiconductor layer, indium zinc oxide (IZO) was sputtered and then, patterned to form a source electrode and drain electrode having each thickness of 40 nm, manufacturing a thin film transistor.

Comparative Example 1

A thin film transistor was manufactured in the same manner as Example 1 except that the In—Ga—Zn precursor solution for oxide semiconductor according to Comparative Preparation Example 1 was used instead of the In—Ga—Zn precursor solution for oxide semiconductor according to Preparation Example 1.

Example 2-1

A thin film transistor was manufactured in the same manner as Example 1 except that the In—Sn—Zn precursor solution for oxide semiconductor according to Preparation Example 2 was used instead of the In—Ga—Zn precursor solution for the oxide semiconductor according to Preparation Example 1 and spray-pyrolyzed at 400° C. (a substrate temperature) to form an oxide semiconductor layer.

Comparative Example 2-1

A thin film transistor was manufactured in the same manner as Example 2-1 except that the In—Sn—Zn precursor solution for oxide semiconductor according to Comparative Preparation Example 2 was used instead of the In—Sn—Zn precursor solution for oxide semiconductor.

Example 2-2

A thin film transistor was manufactured in the same manner as Example 1 except that the In—Sn—Zn precursor solution for oxide semiconductor according to Preparation Example 2 was used instead of the In—Ga—Zn precursor solution for oxide semiconductor according to Preparation Example 1 and spray-pyrolysized at 450° C. (a substrate temperature) to form an oxide semiconductor layer.

Comparative Example 2-2

A thin film transistor was manufactured in the same manner as Example 2-2 except that the In—Sn—Zn precursor solution for oxide semiconductor according to Comparative Preparation Example 2 was used instead of the In—Sn—Zn precursor solution for oxide semiconductor according to Preparation Example 2.

Example 3

A thin film transistor was manufactured in the same manner as Example 1 except that the In—Ga—Sn precursor solution for oxide semiconductor according to Preparation Example 3 was used instead of the In—Ga—Zn precursor solution for oxide semiconductor according to Preparation Example 1.

Comparative Example 3

A thin film transistor was manufactured in the same manner as Example 3 except that the In—Ga—Sn precursor solution for oxide semiconductor according to Comparative Preparation Example 3 was used instead of the In—Ga—Zn precursor solution for oxide semiconductor according to Preparation Example 3.

Example 4

A thin film transistor was manufactured in the same manner as Example 1 except that the Ga—In—Sn—Zn precursor solution for oxide semiconductor according to Preparation Example 4 was used instead of the In—Ga—Zn precursor solution for oxide semiconductor according to Preparation Example 1.

Comparative Example 4

A thin film transistor was manufactured in the same manner as Example 4 except that the Ga—In—Sn—Zn precursor solution for oxide semiconductor according to Comparative Preparation Example 5 was used instead of the Ga—In—Sn—Zn precursor solution for oxide semiconductor according to Preparation Example 4.

Example 5

A 40 nm-thick molybdenum layer was sputtered on a glass substrate, and then patterned to form a gate electrode. On the gate electrode, a 0.2 M aluminum oxide precursor solution (prepared by dissolving aluminum chloride in a mixed solvent of acrylonitrile and ethylene glycol) was spin-coated (2000 rpm, 30 seconds), cured on a 250° C. hot plate for 5 minutes, and heat-treated in a 350° C. furnace to form a 30 nm-thick gate insulating layer. On the gate insulating layer, indium zinc oxide (IZO) was sputtered and patterned to form a source electrode and drain electrode having each thickness of 40 nm. After disposing the substrate on a hot plate, the zinc precursor solution for oxide semiconductor according to Preparation Example 5 was spray-pyrolyzed at 350° C. (about 12 cm of a distance between spray nozzle and substrate, 60 seconds of total time at each cycle in the spraying) to form a 40 nm-thick oxide semiconductor layer, manufacturing a thin film transistor.

Comparative Example 5

A thin film transistor was manufactured in the same manner as Example 5 except that the zinc precursor solution for oxide semiconductor according to Comparative Preparation Example 5 was used instead of the zinc precursor solution for oxide semiconductor according to Preparation Example 5.

Evaluation I

Crystallinity of the oxide semiconductor layers in the thin film transistors according to Examples and Comparative Examples were evaluated.

Figure 7:
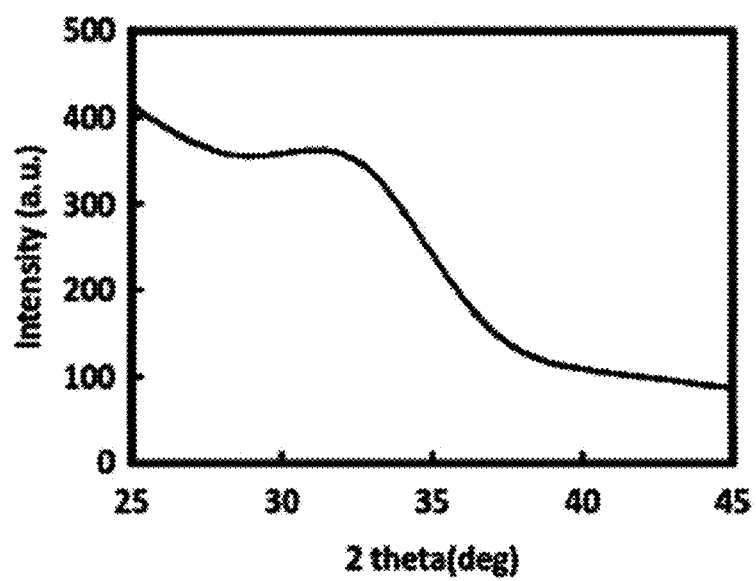
FIG. 7 is an XRD spectrum of an oxide semiconductor layer in the thin film transistor according to Example 1.
Figure 8:
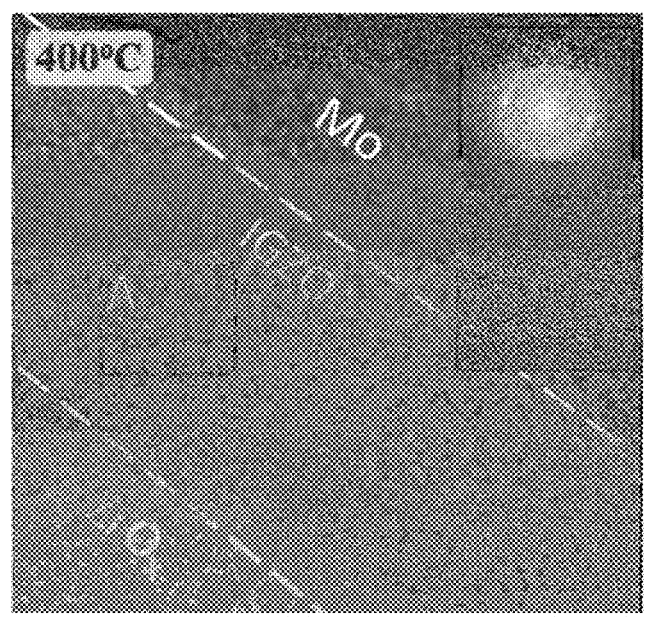
FIG. 8 is a transmission electron microscope (TEM) photograph of the oxide semiconductor layer of the thin film transistor according to Example 1.
Figure 9:
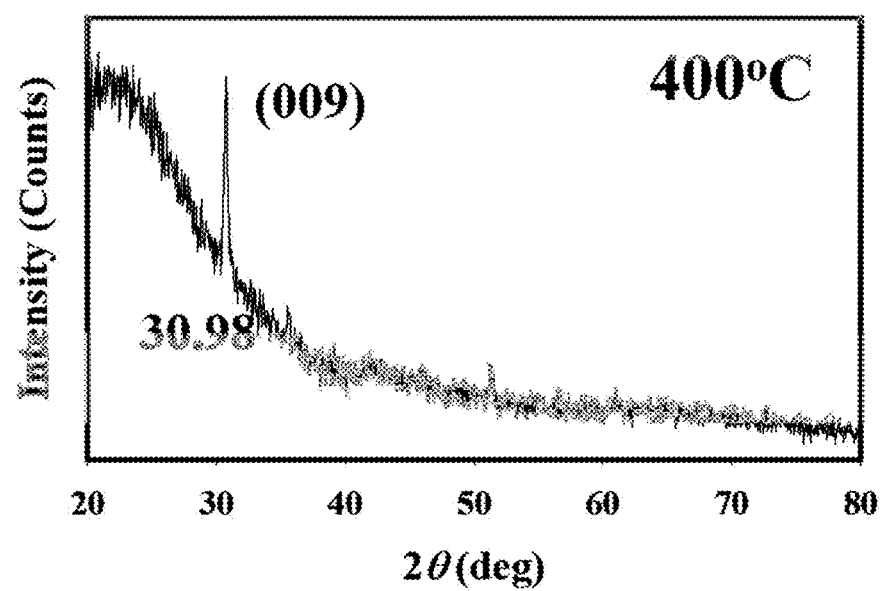
FIG. 9 is an XRD graph of an oxide semiconductor layer in the thin film transistor according to Example 2-1.
Figure 10:
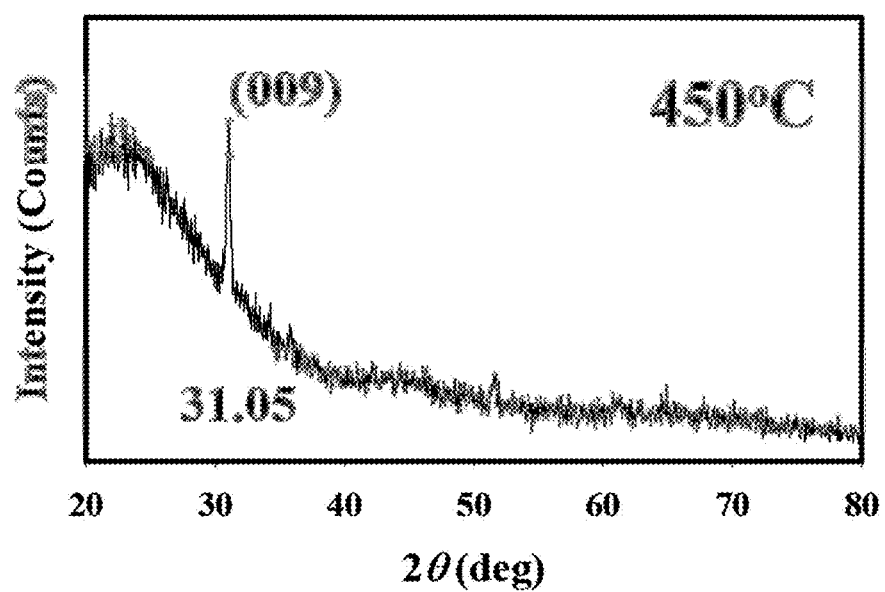
FIG. 10 is an XRD graph of an oxide semiconductor layer in the thin film transistor according to Example 2-2.
Figure 11:
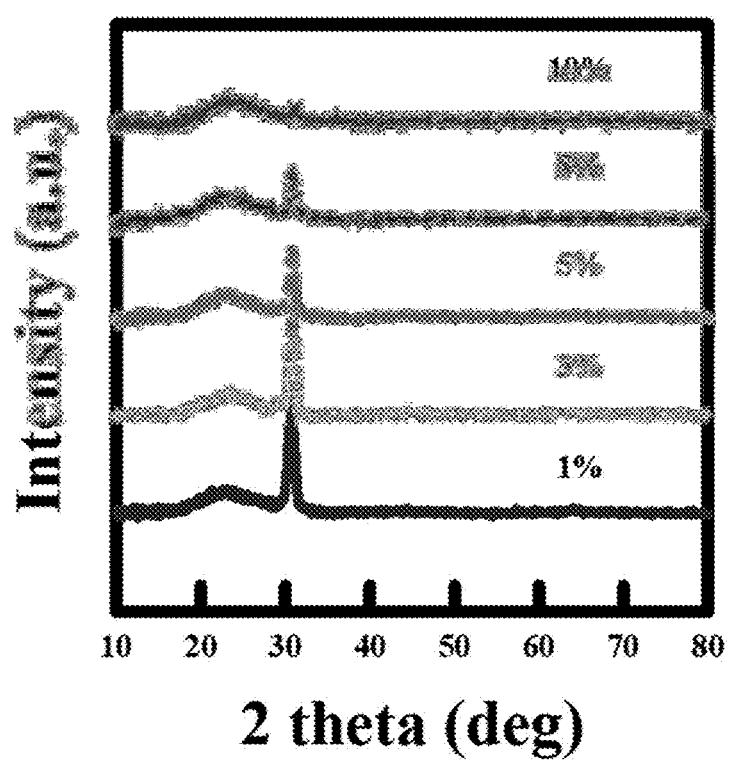
FIG. 11 is an XRD graph of an oxide semiconductor layer in the thin film transistor according to Example 3.
Figure 12:
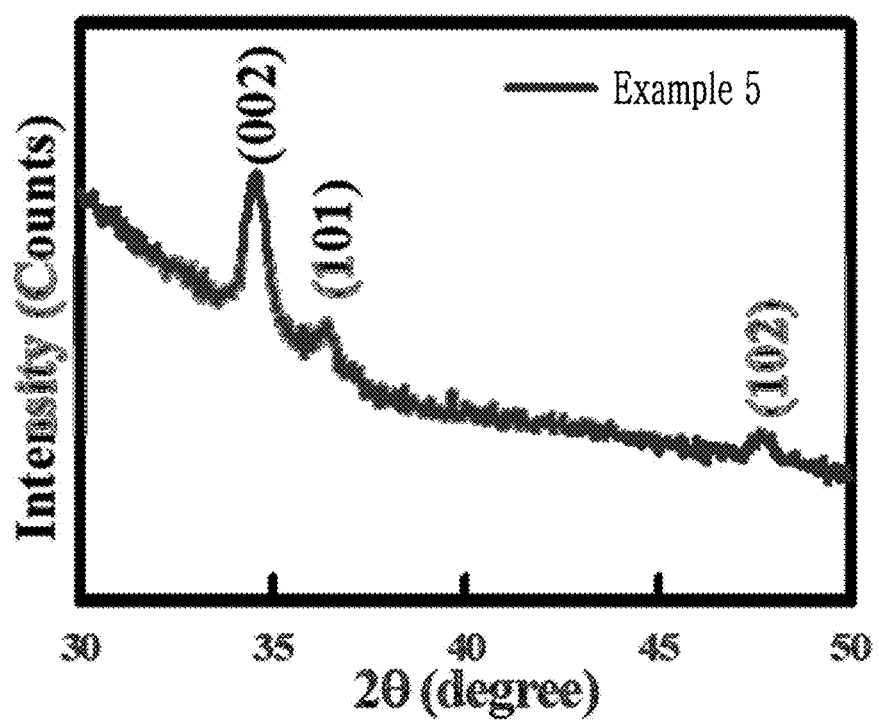
FIG. 12 is an XRD spectrum of an oxide semiconductor layer in a thin film transistor according to Example 5.
Figure 13:
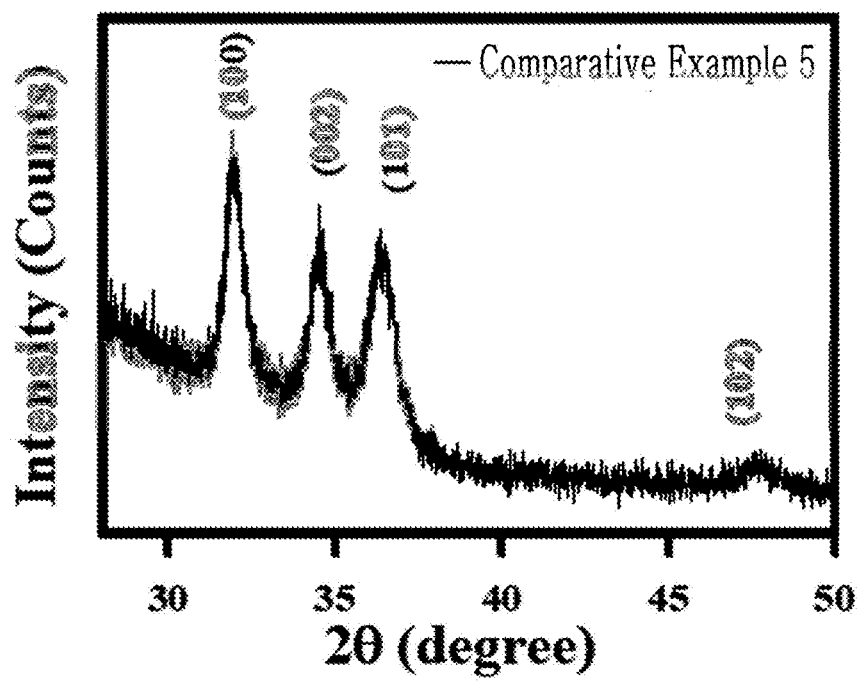
FIG. 13 is an XRD graph of an oxide semiconductor layer in a thin film transistor according to Comparative Example 5.

FIG. 7 is an XRD spectrum of an oxide semiconductor layer in the thin film transistor according to Example 1, FIG. 8 is a transmission electron microscope (TEM) photograph of the oxide semiconductor layer of the thin film transistor according to Example 1, FIG. 9 is an XRD graph of an oxide semiconductor layer in the thin film transistor according to Example 2-1, FIG. 10 is an XRD graph of an oxide semiconductor layer in the thin film transistor according to Example 2-2, FIG. 11 is an XRD graph of an oxide semiconductor layer in the thin film transistor according to Example 3, FIG. 12 is an XRD spectrum of an oxide semiconductor layer in a thin film transistor according to Example 5, and FIG. 13 is an XRD graph of an oxide semiconductor layer in a thin film transistor according to Comparative Example 5.

Referring to FIGS. 7 and 8, the oxide semiconductor layer of the thin film transistor according to Example 1 exhibited a (009) diffraction peak (2θ is about 30 degrees to 32 degrees) in the XRD spectrum and grains aligned in one direction in the TEM photograph, which indicates that it was formed of a c-axis aligned crystalline oxide semiconductor.

Likewise, referring to FIGS. 9 to 12, the oxide semiconductor layers of the thin film transistors according to Examples exhibited a (009) diffraction peak (2θ is about 30 degrees to 32 degrees), which indicates that it was formed of a c-axis aligned crystalline oxide semiconductor.

In particular, comparing FIGS. 12 and 13, the oxide semiconductor layer of the thin film transistor according to Comparative Example 5 exhibited three peaks of an (100) diffraction peak (2θ is about 31.9 degrees), a (002) diffraction peak (2θ is about 34.5°), and a (101) diffraction peak (2θ is about 36.4 degrees) and had a hexagonal ZnO wurtzite crystal structure, but the oxide semiconductor layer of the thin film transistor according to Example 1 exhibited greatly reduced intensity of a (100) diffraction peak and a (101) diffraction peak but a maximum peak of a (002) diffraction peak (2θ is about 34.5 degrees), which indicates that it was formed of a c-axis aligned crystalline oxide semiconductor.

Evaluation II

The thin film states of the oxide semiconductor layers of the thin film transistors according to Examples and Comparative Examples were evaluated.

Figure 14:
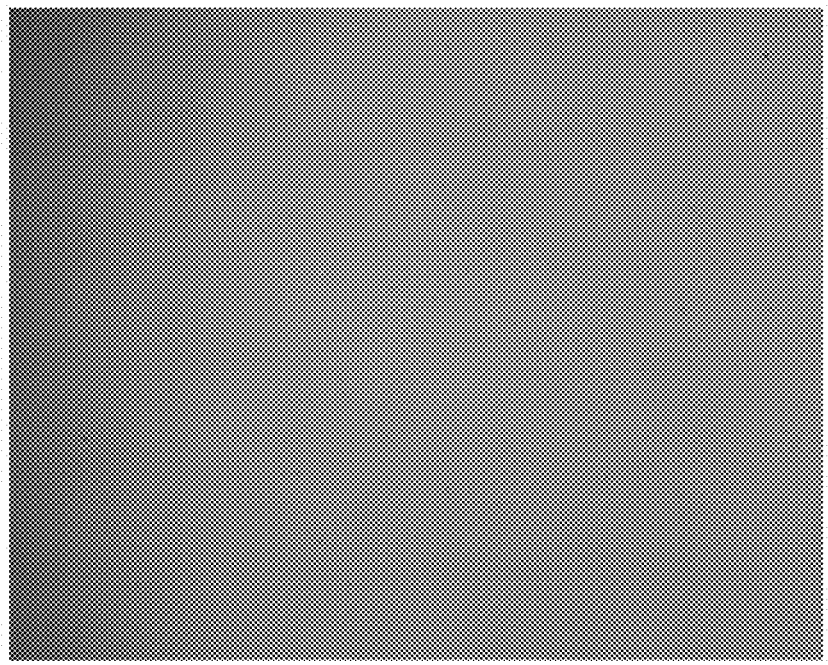
FIG. 14 is an optical microscopic photograph of an oxide semiconductor layer in the thin film transistor according to Example 2-1.
Figure 15:
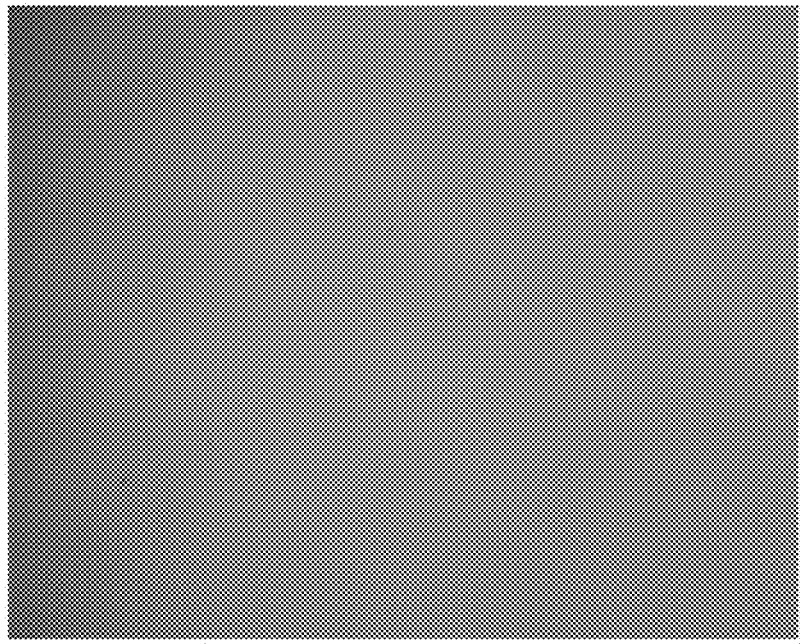
FIG. 15 is an optical microscopic photograph of an oxide semiconductor layer in the thin film transistor according to Example 2-2.
Figure 16:
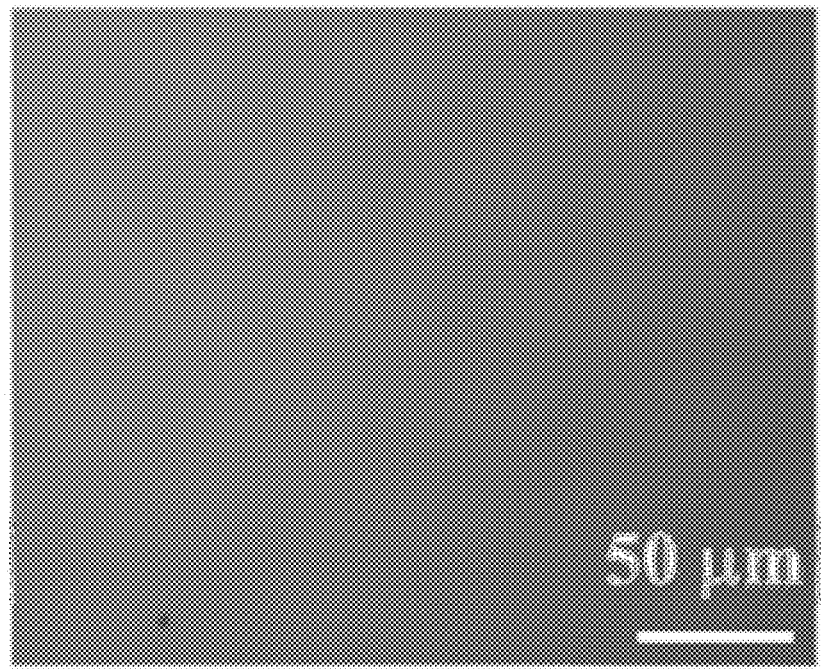
FIG. 16 is an optical microscopic photograph of an oxide semiconductor layer in the thin film transistor according to Example 5.
Figure 17:
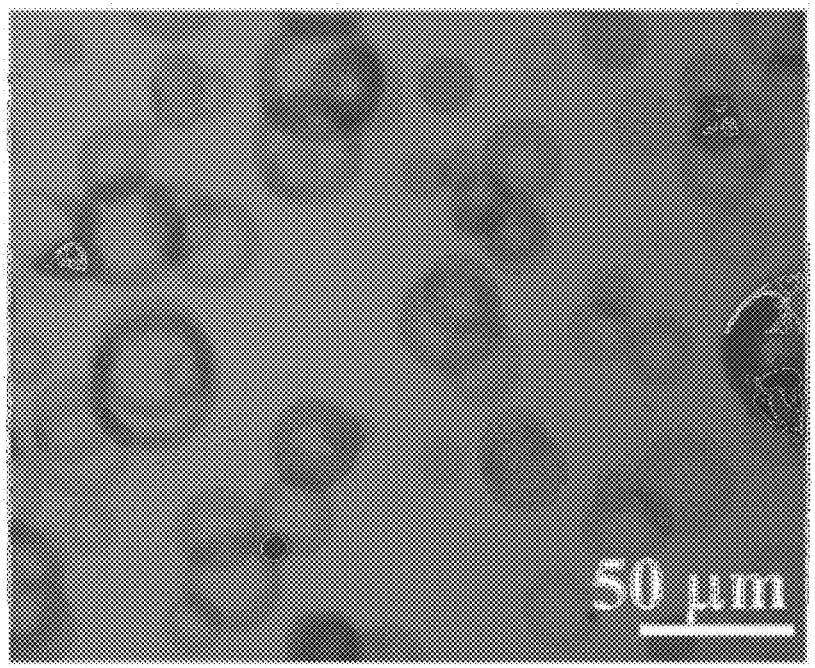
FIG. 17 is an optical microscopic photograph of an oxide semiconductor layer in a thin film transistor according to Comparative Example 5.

FIG. 14 is an optical microscopic photograph of an oxide semiconductor layer in the thin film transistor according to Example 2-1, FIG. 15 is an optical microscopic photograph of an oxide semiconductor layer in the thin film transistor according to Example 2-2, FIG. 16 is an optical microscopic photograph of an oxide semiconductor layer in the thin film transistor according to Example 5, and FIG. 17 is an optical microscopic photograph of an oxide semiconductor layer in a thin film transistor according to Comparative Example 5.

Referring to FIGS. 14 and 15, it was confirmed that the oxide semiconductor layers of the thin film transistors according to Examples 2-1 and 2-2 were formed as a uniform thin film without stains such as coffee rings.

Likewise, referring to FIGS. 16 and 17, the oxide semiconductor layer of the thin film transistor according to Example 5 was formed as a uniform thin film without stains such as coffee rings, but the oxide semiconductor layer of the thin film transistor according to Comparative Example 5 exhibited a plurality of coffee rings.

The results indicate that the oxide semiconductor layers of the thin film transistors according to Examples were formed as a uniform thin film without stains such as coffee rings.

Evaluation III

The grains of the oxide semiconductor layer in the thin film transistors according to Examples and Comparative Examples were evaluated.

Figure 18:
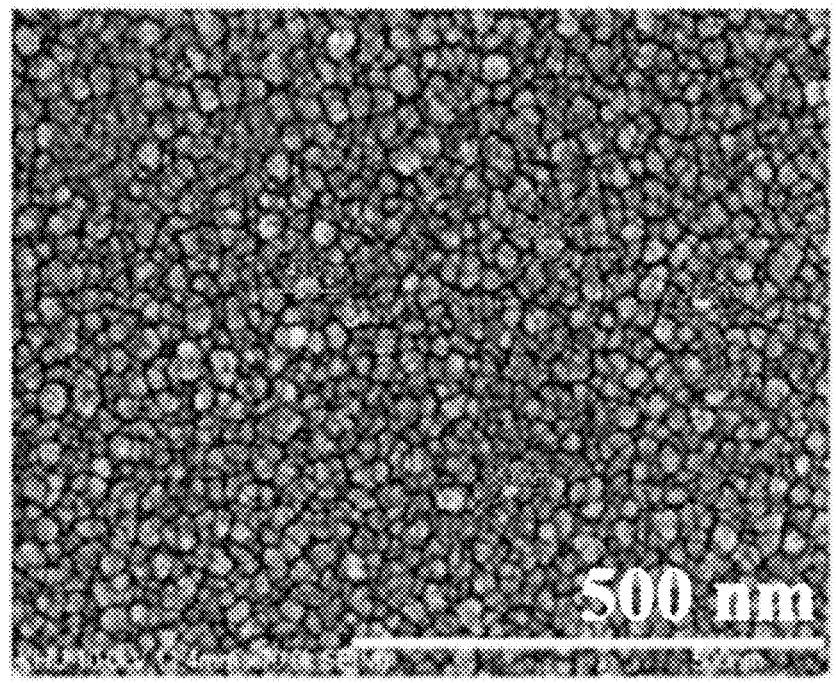
FIG. 18 is a scanning electron microscope (SEM) photograph of an oxide semiconductor layer in the thin film transistor according to Example 5.
Figure 19:
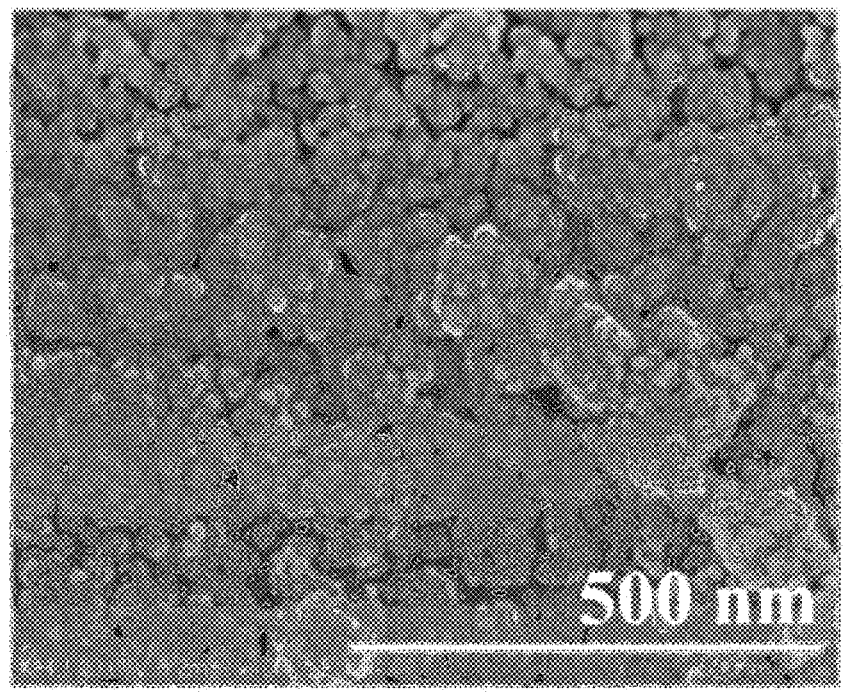
FIG. 19 is a scanning electron microscope (SEM) photograph of an oxide semiconductor layer in a thin film transistor according to Comparative Example 5.

FIG. 18 is a scanning electron microscope (SEM) photograph of an oxide semiconductor layer in the thin film transistor according to Example 5, and FIG. 19 is a scanning electron microscope (SEM) photograph of an oxide semiconductor layer in a thin film transistor according to Comparative Example 5.

Referring to FIGS. 18 and 19, in the oxide semiconductor layer of the thin film transistor according to Example 5, grains with a relatively uniform size were laterally raised and densely aligned, but in the oxide semiconductor layer of the thin film transistor according to Comparative Example 5, grains with various size distributions were observed, and a plurality of the grains were aggregated like clusters.

Accordingly, the oxide semiconductor layer of the thin film transistor according to Example 5 exhibited less defects than that of the thin film transistor according to Comparative Example 5 and thus effectively secured an electrical path of charges.

Evaluation IV

The surface roughness and film density of the oxide semiconductor layers of the thin film transistors according to Example 5 and Comparative Example 5 were evaluated.

The surface roughness of the oxide semiconductor layer was evaluated by using an atomic force microscope (AFM) to trace a surface image of a sample with a sharp probe and then, imaging the trajectory of the surface image.

A film density was evaluated through X-ray reflectivity (XRR), and a thin film thickness and the film density were evaluated through Fast Fourier Transform (FFT).

The results are shown in Table 1.

TABLE 1

|  | Surface roughness (RMS) (nm) | Film density (g/cm$^3$) |
| --- | --- | --- |
| Example 5 | 1.2 | 5.18 |
| Comparative Example 5 | 2.4 | 4.6 |

Referring to Table 1, the oxide semiconductor layer of the thin film transistor according to Example 5 exhibited small surface roughness and a high film density, compared with that of the thin film transistor according to Comparative Example 5.

Evaluation V

The electrical properties of the thin film transistor according to Example 1 were evaluated.

Figure 20:
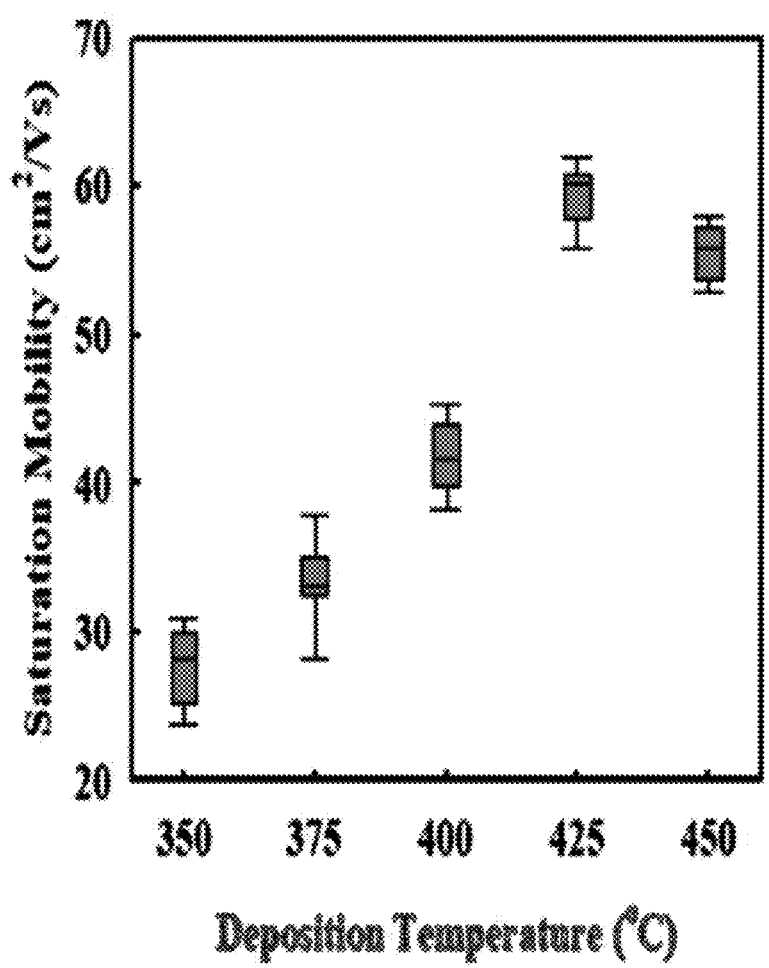
FIG. 20 is a graph showing charge mobility according to spray pyrolysis temperature in the thin film transistor according to Example 1.
Figure 21:
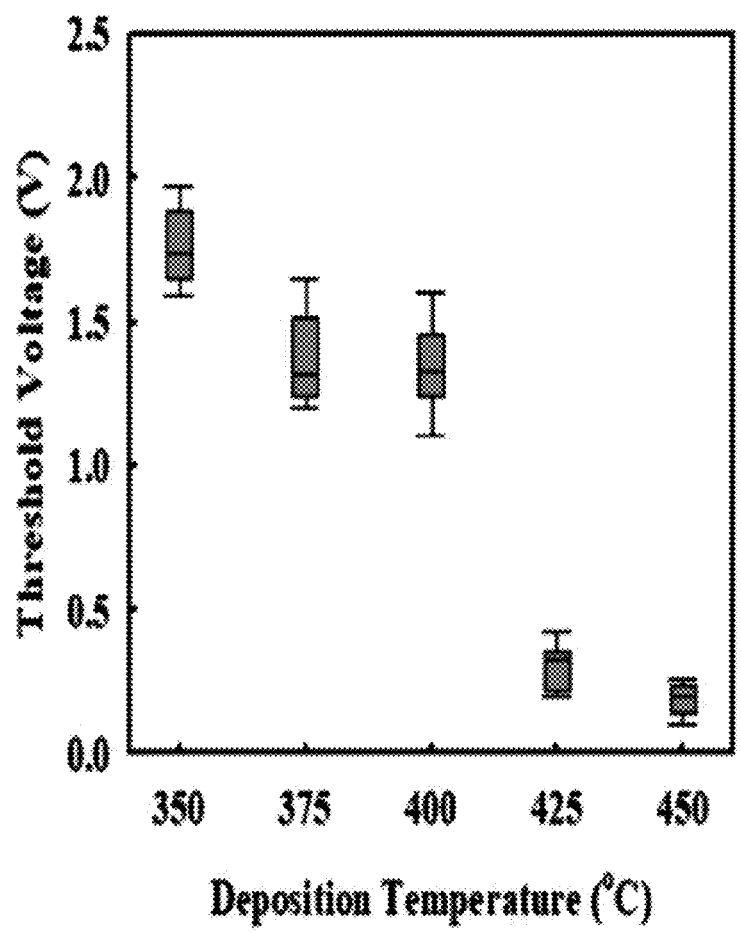
FIG. 21 is a graph showing the threshold voltage according to the spray pyrolysis temperature in the thin film transistor according to Example 1.
Figure 22:
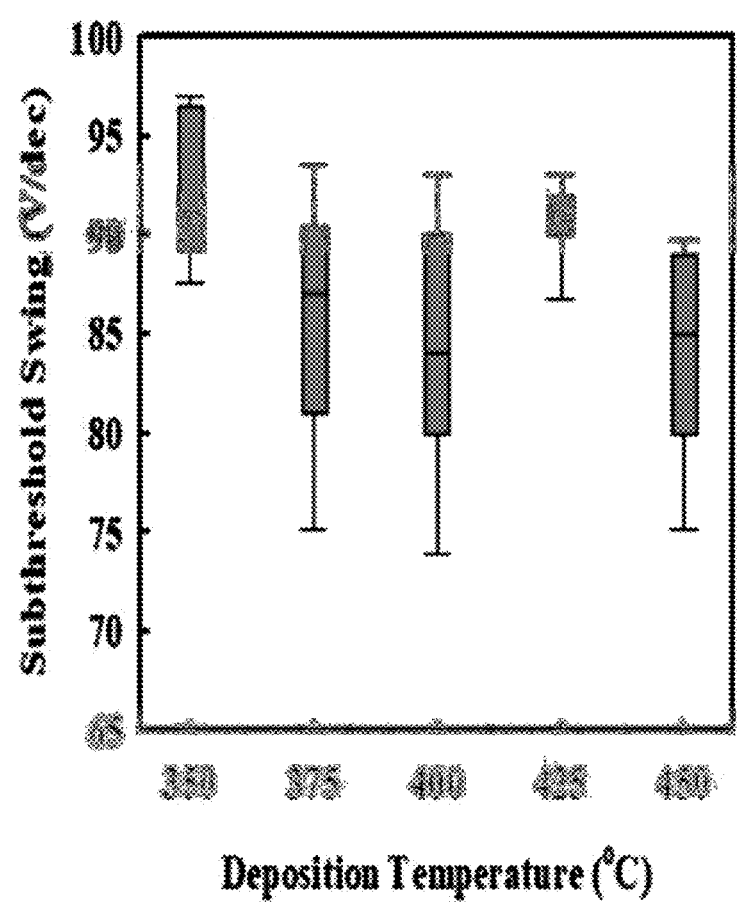
FIG. 22 is a graph showing a subthreshold slope according to a spray pyrolysis temperature in the thin film transistor according to Example 1.

FIG. 20 is a graph showing charge mobility according to spray pyrolysis temperature in the thin film transistor according to Example 1, FIG. 21 is a graph showing the threshold voltage according to the spray pyrolysis temperature in the thin film transistor according to Example 1, and FIG. 22 is a graph showing a subthreshold slope according to a spray pyrolysis temperature in the thin film transistor according to Example 1.

Referring to FIGS. 20 to 22, satisfactory electrical properties in the spray pyrolysis temperature of about 350° C. to 450° C. were achieved.

Evaluation VII

The electrical properties of the thin film transistors according to Example 5 and Comparative Example 5 were evaluated.

The electrical properties of the thin film transistors were evaluated by preparing 15 of each thin film transistor according to Example 5 and Comparative Example 5.

The electrical properties were evaluated by using Probe station to probe a source electrode, a drain electrode, and a gate electrode of each thin film transistor and then, connecting it to a semiconductor parameter analyzer. Through this, a width/length ratio (W/L ratio) of a channel in a transfer curve ($I_{DS}$-$V_{GS}$), capacitance of a gate insulating layer, and charge mobility and threshold voltage of the thin film transistor from the voltage-current equation were evaluated.

Figure 23:
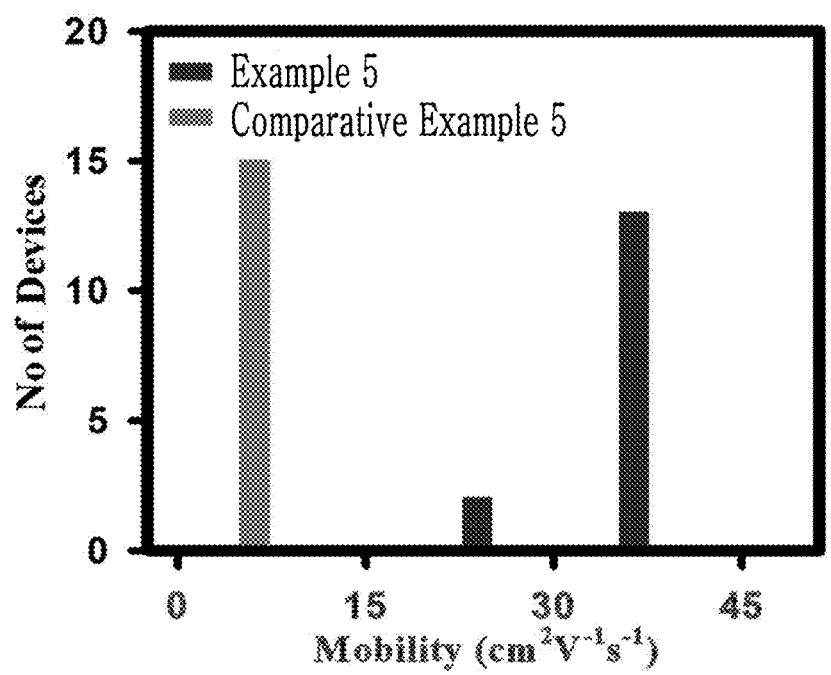
FIG. 23 is a graph showing charge mobility of thin film transistors according to Example 5 and Comparative Example 5.
Figure 24:
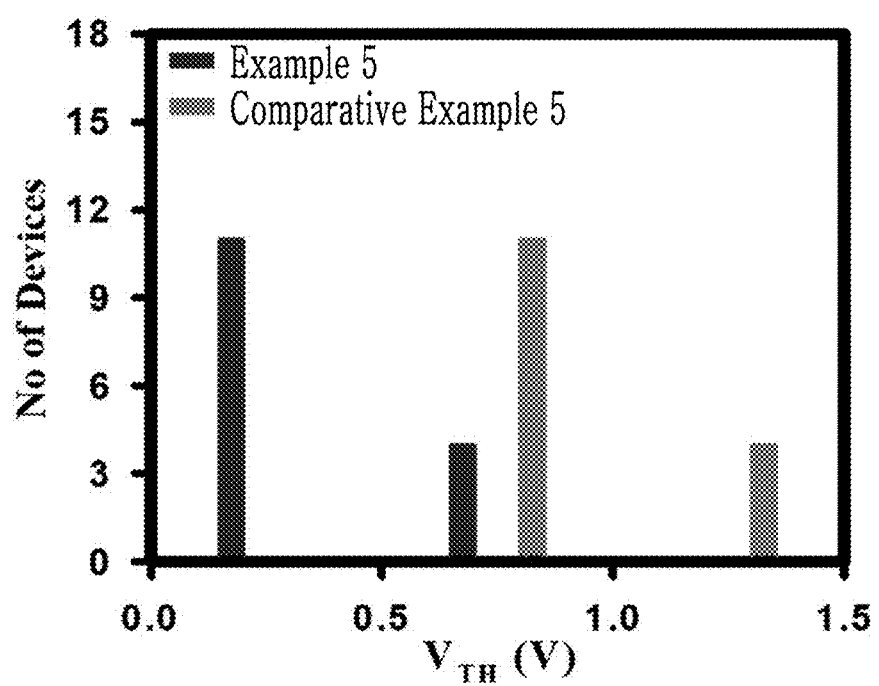
FIG. 24 is a graph showing threshold voltages of thin film transistors according to Example 5 and Comparative Example 5.
Figure 25:
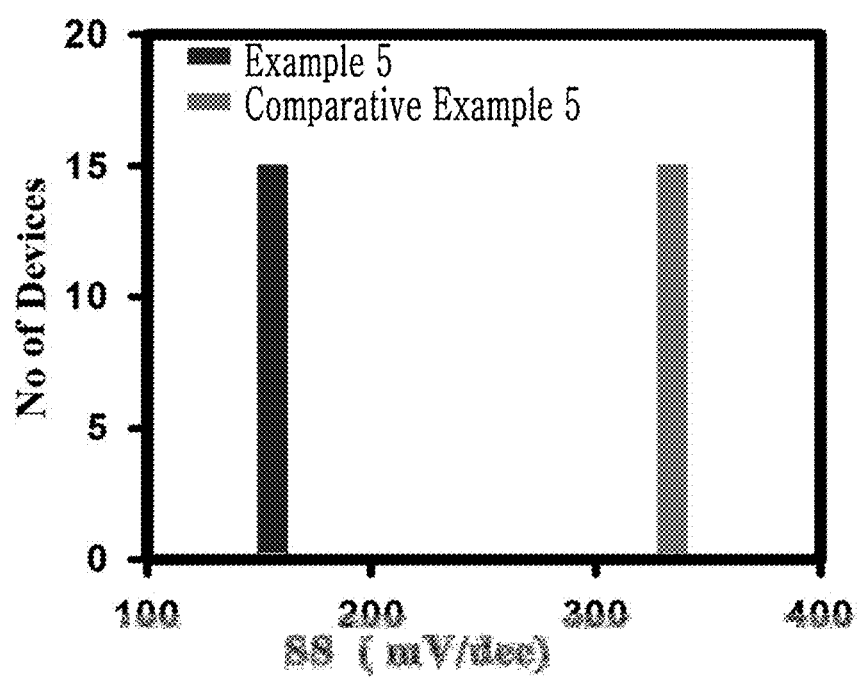
FIG. 25 is a graph showing subthreshold slopes of the thin film transistors according to Example 5 and Comparative Example 5.

FIG. 23 is a graph showing charge mobility of thin film transistors according to Example 5 and Comparative Example 5, FIG. 24 is a graph showing threshold voltages of thin film transistors according to Example 5 and Comparative Example 5, and FIG. 25 is a graph showing subthreshold slopes of the thin film transistors according to Example 5 and Comparative Example 5.

Referring to FIGS. 23 to 25, the thin film transistor according to Example 5 exhibited improved electrical properties, compared with the thin film transistor according to Comparative Example 5.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A method of manufacturing a thin film transistor, comprising:
   forming an oxide semiconductor layer,
   forming a gate electrode overlapped with at least a portion of the oxide semiconductor layer, and
   forming a source electrode and a drain electrode electrically connected to the oxide semiconductor layer,
   wherein the forming of the oxide semiconductor layer comprises
   preparing a precursor solution for an oxide semiconductor, and
   performing spray pyrolysis of the precursor solution for the oxide semiconductor to obtain a c-axis aligned crystalline oxide semiconductor.

2. The method of claim 1, wherein
   the precursor solution for the oxide semiconductor comprises a metal precursor, and
   the metal precursor comprises a zinc precursor or at least three of an indium precursor, a gallium precursor, a tin precursor, and a zinc precursor.

3. The method of claim 1, wherein the precursor solution for the oxide semiconductor comprises an additive containing acetate.

4. The method of claim 3, wherein the additive comprises ammonium acetate.

5. The method of claim 1, wherein the performing of spray pyrolysis of the precursor solution for the oxide semiconductor is performed at about 200° C. to about 500° C.

6. The method of claim 1, wherein the performing of spray pyrolysis of the precursor solution for the oxide semiconductor is performed on a hot plate or a heated substrate holder.

7. The method of claim 1, wherein the c-axis aligned crystalline oxide semiconductor comprises a plurality of grains oriented in one direction.

8. The method of claim 1, wherein the XRD spectrum of the c-axis aligned crystalline oxide semiconductor comprises a (009) diffraction peak as a maximum peak.

9. The method of claim 8, wherein the c-axis aligned crystalline oxide semiconductor comprises one of a c-axis aligned indium-gallium-zinc oxide, a c-axis aligned indium-gallium-tin oxide, a c-axis aligned indium-zinc-tin oxide, or a c-axis aligned crystalline indium-gallium-tin-zinc oxide.

10. The method of claim 1, wherein
    the c-axis aligned crystalline oxide semiconductor is a c-axis aligned zinc oxide, and
    the XRD spectrum of the c-axis aligned zinc oxide comprises a (002) diffraction peak as a maximum peak.

11. The method of claim 1, wherein the c-axis aligned crystalline oxide semiconductor is one of a c-axis aligned indium-gallium-zinc oxide, a c-axis aligned indium-gallium-tin oxide, a c-axis aligned crystalline indium-zinc-tin oxide, a c-axis aligned gallium-indium-tin-zinc oxide, or a c-axis aligned zinc oxide.

12. The method of claim 1,
    further comprising before forming the source electrode and the drain electrode
    exposing a portion of the c-axis aligned crystalline oxide semiconductor, and
    supplying a fluorine-containing gas to an exposed region of the c-axis aligned crystalline oxide semiconductor to perform plasma treatment.

13. The method of claim 12, wherein
    the fluorine-containing gas comprises at least one of carbon tetrafluoride $CF_4$, nitrogen trifluoride $NF_3$, or sulfur hexafluoride $SF_6$, and
    the plasma treatment is performed at about 20° C. to about 420° C.

14. A thin film transistor manufactured by the method of claim 1.

15. A display panel comprising the thin film transistor of claim 14.

16. An electronic device comprising the thin film transistor of claim 14.

* * * * *